United States Patent [19]
Conan

[11] Patent Number: 5,249,153
[45] Date of Patent: Sep. 28, 1993

[54] READING PRE-CHARGE CIRCUIT FOR INTEGRATED CIRCUIT MEMORY

[75] Inventor: Bertrand Conan, Aix en Provence, France

[73] Assignee: SGS-Thomson Microelectronics S.A., Gentilly, France

[21] Appl. No.: 746,698

[22] Filed: Aug. 19, 1991

[30] Foreign Application Priority Data

Aug. 17, 1990 [FR] France .................. 90 10426

[51] Int. Cl.[5] .............................................. C11C 13/00
[52] U.S. Cl. .............................. 365/203; 365/189.01
[58] Field of Search ............ 365/203, 189.01, 230.01

[56] References Cited
U.S. PATENT DOCUMENTS 4,289,982 9/1981 Smith .................................. 307/463
5,007,026 4/1991 Gaultier et al. ..................... 365/201
5,121,356 6/1992 Park et al. ........................... 365/203

FOREIGN PATENT DOCUMENTS 0212451 3/1987 European Pat. Off. .
9003033 3/1990 World Int. Prop. O. .

Primary Examiner—Terrell W. Fears

[57] ABSTRACT

In order to improve the access time, in reading mode, to the information elements contained in an integrated circuit memory, especially electrically programmable memories such as EPROMs, a circuit for pre-charging the bit line is used and the build-up speed of the potential of the bit line is increased by making a transistor conductive during the pre-charging stage. This transistor is also designed to applying a programming potential Vpp during the stage for programming of the memory.

25 Claims, 1 Drawing Sheet

READING PRE-CHARGE CIRCUIT FOR INTEGRATED CIRCUIT MEMORY

FIELD OF THE INVENTION

The invention relates to integrated circuit memories, and quite particularly but not exclusively, to electrically programmable memories (notably EPROMs and EEPROMs). These memories are organized in columns of cells, and each column comprises numerous cells.

BACKGROUND OF THE INVENTION

One of the major parameters to be considered for a memory is the speed of access in a reading mode, i.e. the possibility of speedily reading the memorized state in a chosen cell. A memory with a large cell capacity has a correspondingly slow access in reading mode. It is therefore necessary to find means to accelerate the reading of large memories.

In particular, one of the reasons for the slowness of access to large memories is the high time constant due to the capacitance the access resistance of the bit lines of the memory. The bit lines are conductors used to transmit the signal representing the information memorized in a cell.

In principle, an entire column of cells is connected to one end and the same bit line, so that the capacitance of a bit line is the sum of several hundreds of individual cell capacities.

For floating-gate transistor memories for example, each individual cell has a high capacitance when viewed from the bit line (the drain-gate capacitance of the floating-gate transistor). The sum of the capacities may become very high.

The access resistance comprises all the resistances in series between a cell to be read and the reading amplifier used to read the signal coming from this cell. These resistances include the contact resistance between metallizations and semiconductor zones, the resistance of the metallizations, the internal source-drain resistance of the selection transistors series-connected in the bit line between the cell and the reading amplifier, etc. These resistances have high values.

The result thereof is that there are necessary limits placed on access speed, since any variation in current or voltage due to the information memorized by the cell will be transmitted with a certain time constant.

To accelerate access to the information elements, the reading of a cell is generally done in two stages: a pre-charging stage and a detection stage (namely the reading stage).

During the pre-charging stage, which is generally set off automatically upon the detection of an address of a cell to be read, a predetermined voltage is applied to a corresponding bit line. This predetermined voltage will correspond to the voltage at which the current of the addressed cell will be measured during the reading stage. For example, the bit line can be precharged to approximately one volt.

During this reading stage, the current needed for the reading is injected into the addressed cell, and the voltage variation at the reading amplifier output is examined.

Since the procedure for accelerating the reading is carried out in two stages, the pre-charging stage should be as short as possible.

It is an aim of the invention to accelerate the pre-charging stage.

The pre-charging circuit most conventionally used (because it is particularly simple) is shown in FIG. 1. It comprises a current-voltage converter CIV connected to the bit line by the series-connected access transistors T1 and T2, which are used for the selection of a particular bit line. The current-voltage converter CIV comprises a servo-control circuit for servo-linking the potential of the bit line to a predetermined pre-charging voltage during a pre-charging stage and, secondly, a circuit for transmitting a signal towards a reading amplifier AL, said signal representing the current that goes through a selected cell during a reading stage.

The access transistors T1 and T2, which are made conductive by addressing signals designating a particular bit line, are used to connect the designated bit line to the current-voltage converter CIV during the reading. They are also used to select a bit line at programming stages during which a high programming voltage $V_{pp}$ is applied to the selected bit line.

The converter CIV should not, however, receive the high voltage $V_{pp}$, and this is why this voltage $V_{pp}$ is applied in a programming stage to the node between the transistors T1 and T2, the transistor T1 being conductive (to connect $V_{pp}$ to the bit line) while T2 is off (to isolate the converter CIV from $V_{pp}$).

The voltage $V_{pp}$ is applied only in a programming stage, and a transistor Tp, made conductive during this programming stage by a programming signal PRG, is connected between a voltage source at the potential $V_{pp}$ and the connecting node A between the transistors T1 and T2.

SUMMARY OF THE INVENTION

According to the invention, to accelerate the pre-charging, it is proposed to make the transistor Tp temporarily conductive at the beginning of the pre-charging stage to connect the bit line to a supply voltage source.

Consequently, the invention proposes the use of a circuit to make a transistor temporarily conductive during a stage of pre-charging a bit line before reading a memory cell on that bit line, said transistor being also designed to connect a programming voltage to the bit line during a programming stage.

One of the very major advantages of this approach is the fact that the transistor Tp is a large-sized transistor since it must be capable of programming one or more lines of calls at a time. It therefore enables the voltage of the bit line to be raised very swiftly until it reaches the desired, set pre-charging value, after which the pre-charging voltage is maintained by the servo-control circuit of the converter CIV.

BRIEF DESCRIPTION OF THE DRAWINGS

Other characteristics and advantages of the invention shall appear from the following detailed description, made with reference to the appended drawings, of which.

DETAILED DESCRIPTION OF THE INVENTION

Figure 1:
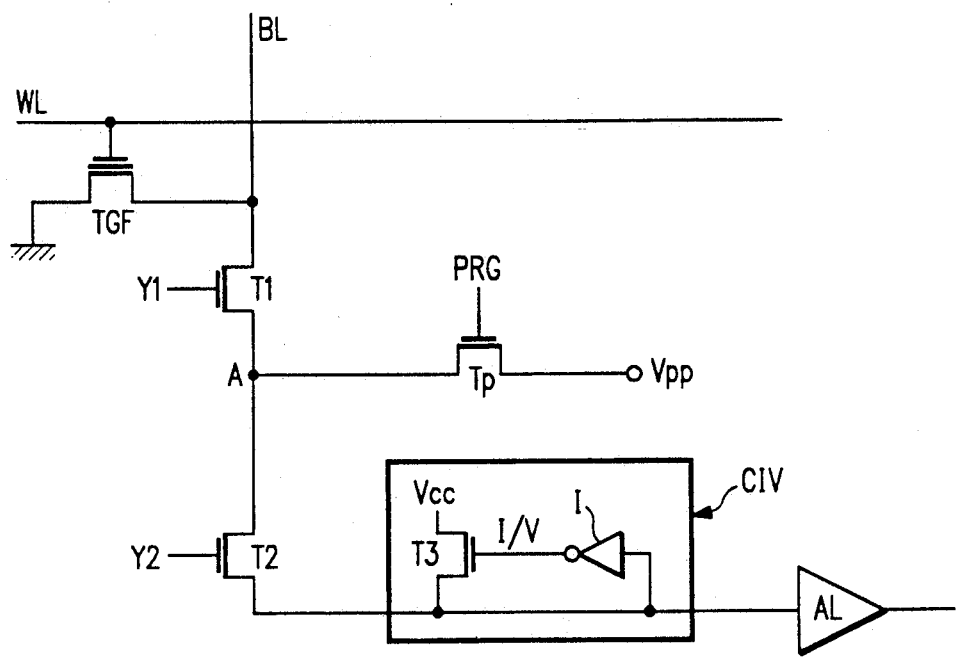
FIG. 1, already described, shows a prior art pre-charging circuit.
Figure 2:
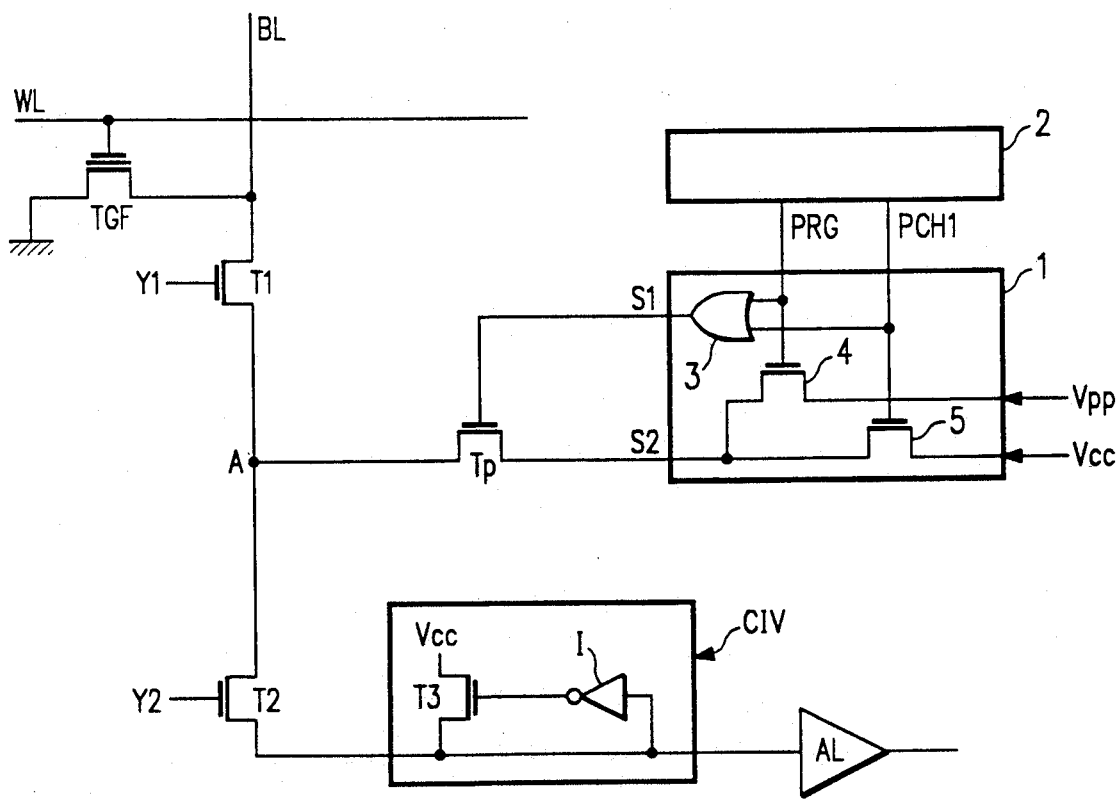
FIG. 2 shows a pre-charging circuit according to the invention.

The circuit of FIG. 2 is similar to that of FIG. 1, but the pre-charging transistor Tp is made conductive not only during a stage for the programming of an information element in a cell of the memory but also during a pre-charging stage (at least at the beginning of this stage) before the reading of the state memorized in a cell.

This is why a control device 1, which receives a programming signal PRG and a pre-charging signal PCH1 from a phase signal generator 2, controls a signal which is applied to the gate of the programming transistor Tp, signifying that the transistor Tp is made conductive by the programming signal during a programming stage and by the pre-charging signal during a stage which represents all or a part of a pre-charging stage PCH.

The control device 1 has a first output S1 connected to the gate of the programming transistor Tp and a second output S2 connected to the drain of the programming transistor Tp. The control device 1 receives a programming signal PRG, which is made active during the programming stage, and a pre-charging signal PCH1, which is made active during all or a part of the pre-charging stage. Finally the control device 1 receives a programming voltage Vpp and a pre-charging voltage Vcc.

As illustrated in FIG. 2, the programming signal PRG and the pre-charging signal PCH1 can be applied to respective inputs of OR circuit 3. The output of OR circuit 3 can be connected to the gate of transistor Tp. The programming voltage Vpp can be connected through the current path of transistor 4 to output S2, while the pre-charging voltage Vcc can be connected through the current path of transistor 5 to output S2. The programming signal PRG can be applied to the gate of transistor 4 to render transistor 4 conductive only when the programming signal PRG is present, while the pre-charging signal PCH1 can be applied to the gate of transistor 5 to render transistor 5 conductive only when the programming signal PRG is present.

When neither the programming signal PRG nor the pre-charging signal PCH1 is active, the control device 1 does not impose any voltage on the outputs S1 and S2, and as a result the programming transistor Tp is not conductive under such circumstances.

When the programming signal PRG is active, the control device applies the programming voltage Vpp to the second output S2, and it applies the programming signal PRG to the first output Si. The programming transistor Tp is then conductive, and the programming voltage Vpp is applied to the bit line BL through transistor T1.

When the pre-charging signal PCH1 is active, the control device applies the pre-charging voltage Vcc to the second output S2, and it applies the pre-charging signal PCH1 to the first output S1. Thus, the programming transistor Tp is made conductive during all or a part of the pre-charging stage in the reading mode.

It will be noted that, during the programming stage, the transistor Tp receives a high programming voltage Vpp at its drain. But, during the pro-charging stage, the voltage present at the drain will generally be a normal supply voltage Vcc, which is lower than Vpp. If the converter CIV could bear the higher voltage Vpp, the Vpp voltage could also be applied to the drain of transistor Tp during the pre-charging stage. This could be accomplished by applying signals PRG and PCH1 through an OR circuit to the gate of transistor 4, and omitting the transistor 5.

The source of the transistor Tp is connected to the node A between the series-connected transistors T1 and T2. Transistor T1 is also connected to the bit line BL. Transistor T2 is also connected to the input of the converter CIV, the output of which is connected to an input of a reading amplifier AL.

The transistor T1 is made conductive by an addressing signal Y1 used to designate the particular bit line BL among other bit lines of the memory (this is the case in both reading and writing modes).

The transistor T2 is made conductive by an addressing signal used to designate the particular bit line BL, but only in the reading mode (the pre-charging and the reading itself).

The cell to be read is, in this example, a floating-gate EPROM transistor TGF, the drain of which is connected to the bit line BL and the gate of which is connected to a word line WL.

The converter CIV, here too, has two roles:

(a) during the pre-charging stage PCH, its role is to set up a pre-charging voltage (for example, about 1 volt), through the transistors T1 and T2, on the bit line BL and to servo-link the pre-charging voltage to a set value.

(b) during the reading stage itself, its role is to send the reading amplifier AL a signal representing the information stored in the selected cell.

In its simplest embodiment, the converter CIV comprises a single transistor T3 with its drain connected to a supply Vcc, its source connected to the transistor T2, hence to the bit line BL, and its gate connected to its source by means of an inverter I.

This very simple assembly constitutes a servo-control circuit that sets up, on the source of transistor T3, a pre-charging voltage related to the technological characteristics of the transistor T3 and of the inverter I.

At the beginning of the pre-charging stage, the pre-charging potential of the bit line tends exponentially towards the desired set value. It is therefore necessary to wait a fairly long time before going to the reading stage itself, which consists in setting up the reading command on the word line.

According to the invention, the pre-charging is set up with a far sharper slope of growth, in turning on the transistor Tp which is large-sized and is connected, at this instant, to the supply voltage Vcc.

The voltage desired on the bit line is reached very swiftly, and it is then possible to turn the transistor Tp off. The converter CIV then takes over the task and servo-links the bit line to the desired voltage. Hence, the pre-charging signal PCH1, which is made active during a period which is shorter than the pre-charging phase, is used to make the transistor Tp conductive.

It is also possible to act on the value of the supply voltage of the drain of Tp to control the level of the voltage of the bit line at the end of the stage PCH1.

The circuit according to the invention enables an access time that is reduced in reading mode for memories with large capacities (several megabits).

What is claimed is:

1. An integrated circuit memory comprising:
   a pre-charging and current-voltage converter circuit connected to apply, on a bit line, a pre-charging voltage, during a pre-charging stage that precedes a reading stage, and to apply a weak load on said bit line thereafter;

a programming transistor connected to apply a programming voltage Vpp to said bit line during a programming stage; and control logic connected and configured to make said programming transistor conductive at the beginning of said pre-charging stage and to thereby connect the bit line through this transistor to a voltage source.

2. An integrated circuit memory according to claim 1, wherein the drain of said programming transistor is connected to a normal supply voltage Vcc during the pre-charging stage and to said programming voltage Vpp during the programming stage, said programming voltage Vpp being a higher voltage than said normal supply voltage Vcc.

3. An integrated circuit memory according to claim 1 wherein said programming transistor is conductive during said pre-charging stage for only the beginning part of said pre-charging stage.

4. An integrated circuit memory according to claim 1 wherein said programming transistor is conductive during all of said pre-charging stage.

5. An integrated circuit memory according to claim 1 wherein said programming transistor is connected to a node between a second transistor and a third transistor which are connected in series between said bit line and said pre-charging and current voltage converter circuit, with said second transistor being connected to said bit line and said third transistor being connected to said pre-charging and reading circuit, whereby an addressing signal can be applied to said second transistor during each of said programming stage, said pre-charging stage, and said reading stage, to thereby render said second transistor conductive during said programming stage, during said pre-charging stage, and during said reading stage, and an addressing signal can be applied to said third transistor only during said pre-charging stage and said reading stage, to thereby render said third transistor conductive only during said pre-charging stage and said reading stage.

6. An integrated circuit memory according to claim 5 wherein the source of said programming transistor is connected to said node, and wherein the drain of said programming transistor is connected to a normal supply voltage Vcc during the pre-charging stage and to said programming voltage Vpp during the programming stage, said programming voltage Vpp being a higher voltage than said supply voltage Vcc.

7. An integrated circuit memory comprising:

a pre-charging and current-voltage converter circuit connected to apply, on a bit line, a pre-charging voltage, during a pre-charging stage that precedes a reading stage, and to apply a weak load on said bit line thereafter;

a programming transistor operatively connected from said bit line to two different selectable power supply voltage nodes; and a control circuit connected to control said programming transistor, and configured to apply a programmable voltage through said transistor to the bit line during a programming stage, and to apply pre-charging voltage through said transistor to the bit line during at least a portion of said pre-charging stage.

8. An integrated circuit memory according to claim 7, wherein the drain of said programming transistor is connected to a normal supply voltage during the pre-charging stage and to said programming voltage during the programming stage, said programming voltage being a higher voltage than said normal supply voltage.

9. An integrated circuit memory according to claim 7 wherein said programming transistor is conductive during said pre-charging stage for only the beginning part of said pre-charging stage.

10. An integrated circuit memory according to claim 7 wherein said programming transistor is conductive during all of said pre-charging stage.

11. An integrated circuit memory according to claim 7 wherein said programming transistor is connected to a node between a second transistor and a third transistor which are connected in series between said bit line and said pre-charging and current voltage converter circuit, with said second transistor being connected to said bit line and said third transistor being connected to said pre-charging and reading circuit, whereby an addressing signal can be applied to said second transistor during each of said programming stage, said pre-charging stage, and said reading stage, to thereby render said second transistor conductive during said programming stage, during said pre-charging stage, and during said reading stage, and an addressing signal can be applied to said third transistor only during said pre-charging stage and said reading stage, to thereby render said third transistor conductive only during said pre-charging stage and said reading stage.

12. An integrated circuit memory according to claim 11 wherein the source of said programming transistor is connected to said node, and wherein the drain of said programmable transistor is connected to a normal supply voltage during the pre-charging stage and to said programming voltage during the programming stage, said programming voltage being a higher voltage than said normal supply voltage.

13. In a method of operating an integrated circuit memory having a bit line and at least one memory cell associated with said bit line, which comprises:

utilizing a transistor to apply a programming voltage Vpp to said bit line during a programming stage for programming a memory cell associated with said bit line;

utilizing a pre-charging and reading circuit to apply a pre-charging voltage to said bit line during a pre-charging stage that precedes a reading stage for reading the memorized state in a selected memory cell associated with said bit line; and utilizing said pre-charging and reading circuit during said reading stage to read the memorized state in a selected memory cell associated with said bit line;

the improvement comprising applying a pre-charging voltage to said transistor and making said transistor conductive to apply said pre-charging voltage to said bit line at the beginning of said pre-charging stage.

14. A method in accordance with claim 13, wherein the drain of the transistor is connected to a normal supply voltage Vcc during the pre-charging stage as the source of said pre-charging voltage, and to said programming voltage Vpp during the programming stage, said programming voltage Vpp being a higher voltage than said normal supply voltage Vcc.

15. A method in accordance with claim 13 wherein said transistor is conductive during said pre-charging stage for only the beginning part of said pre-charging stage.

16. A method in accordance with claim 13 wherein said transistor is conductive during all of said pre-charging stage.

17. A method in accordance with claim 13 wherein said pre-charging voltage is said programming voltage Vpp.

18. A method in accordance with claim 13:
wherein said transistor is connected to a node between a second transistor and a third transistor which are connected in series between said bit line and said pre-charging and reading circuit, with said second transistor being connected to said bit line and said third transistor being connected to said pre-charging and reading circuit,
wherein an addressing signal is applied to said second transistor during each of said programming stage, said pre-charging stage, and said reading stage, to thereby render said second transistor conductive during said programming stage, during said pre-charging stage, and during said reading stage, and
wherein an addressing signal is applied to said third transistor only during said pre-charging stage and said reading stage, to thereby render said third transistor conductive only during said pro-charging stage and said reading stage.

19. The integrated circuit of claim 1, wherein said programming transistor is N-channel.

20. The integrated circuit of claim 1, wherein said precharging circuit comprises a weak N-channel transistor connected between said bitline and a positive power supply, together with an inverter connected from said bit line to the gate of said weak N-channel transistor.

21. The integrated circuit of claim 7, wherein said precharging circuit comprises a weak N-channel transistor connected between said bitline and a positive power supply, together with an inverter connected from said bit line to gate of said weak N-channel transistor.

22. The integrated circuit of claim 7, wherein said programming transistor is N-channel.

23. An integrated circuit memory, comprising:
a pre-charging and current-voltage converter circuit operatively connected to weakly drive a bit line toward a pre-charging voltage;
a programming transistor operatively connected, through multiple additional transistors, to selectably apply either a programming voltage Vpp or a logic supply voltage Vcc to said bit line; and
control logic connected to control said programming transistor and said additional transistors, and configured
to turn on said programming transistor at the beginning of a pre-charging stage, and to control said additional transistors so that said programming transistor pulls said bit line toward said pre-charging voltage, and
to turn on said programming transistor during a programming stage, and to control said additional transistors so that said programming transistor pulls said bit line toward a programming voltage which is greater than said pre-charging voltage.

24. The integrated circuit of claim 23, wherein said programming transistor is N-channel, and at least one of said additional transistors is also N-channel.

25. The integrated circuit of claim 23, wherein said precharging circuit comprises a weak N-channel transistor connected between said bitline and a positive power supply, together with an inverter connected from said bit line to the gate of said weak N-channel transistor.

* * * * *